United States Patent [19]
Pasch

[11] Patent Number: 5,883,000
[45] Date of Patent: *Mar. 16, 1999

[54] CIRCUIT DEVICE INTERCONNECTION BY DIRECT WRITING OF PATTERNS THEREIN

[75] Inventor: Nicholas F. Pasch, Pacifica, Calif.

[73] Assignee: LSI Logic Corporation, Milpitas, Calif.

[*] Notice: The term of this patent shall not extend beyond the expiration date of Pat. No. 5,721,150.

[21] Appl. No.: 924,248

[22] Filed: Sep. 5, 1997

Related U.S. Application Data

[63] Continuation of Ser. No. 614,024, Mar. 12, 1996, Pat. No. 5,721,150, and a continuation of Ser. No. 434,273, May 3, 1995, abandoned, and a division of Ser. No. 143,195, Oct. 25, 1993, abandoned.

[51] Int. Cl.$^6$ ................................................. H01L 21/265
[52] U.S. Cl. ........................................... 438/618; 438/491
[58] Field of Search .................................. 438/598, 487, 438/659, 936, 491, 514

[56] References Cited

U.S. PATENT DOCUMENTS

| | | | |
|---|---|---|---|
| 4,367,925 | 1/1983 | Sprague et al. | 359/263 |
| 4,593,306 | 6/1986 | Marchant et al. | 257/448 |
| 4,771,010 | 9/1988 | Epler et al. | 438/797 |
| 4,803,528 | 2/1989 | Pan Kove | 257/410 |
| 5,041,361 | 8/1991 | Tsuo | 438/694 |
| 5,047,827 | 9/1991 | Clark et al. | 257/537 |
| 5,113,072 | 5/1992 | Yamaguchi et al. | 250/309 |
| 5,149,976 | 9/1992 | Sipma | 250/492.2 |
| 5,202,571 | 4/1993 | Hirabayashi et al. | 257/10 |

*Primary Examiner*—John F. Niebling
*Assistant Examiner*—S. Mulpuri
*Attorney, Agent, or Firm*—Dewan & Lally LLP

[57] ABSTRACT

An apparatus and method wherein conductive patterns are written in amorphous silicon or polysilicon deposited on an integrated circuit and used for interconnecting circuit elements contained therein. The substantially pure amorphous silicon or polysilicon is deposited onto an integrated circuit face at low temperature. A Focused Ion Beam deposition system deposits dopant atoms into the deposited pure silicon in a desired pattern. The dopant atoms are then activated by heat from a focused laser beam which adiabatically anneals the specifically doped areas of the deposited silicon. The resulting annealed doped areas of the silicon have low resistance suitable for circuit conductors. The surrounding undoped silicon remains a high resistance and a good insulator.

5 Claims, 1 Drawing Sheet

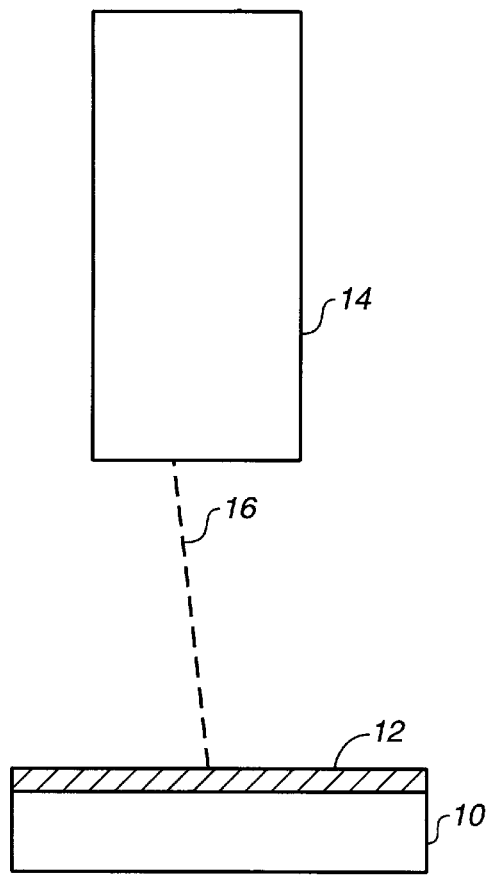
FIG._1
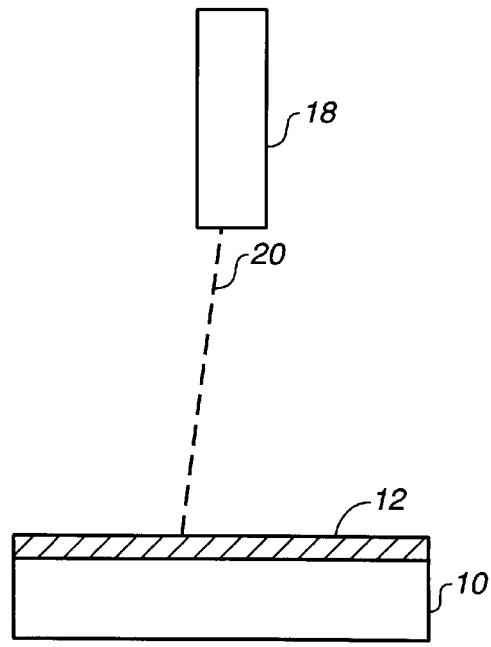
FIG._2
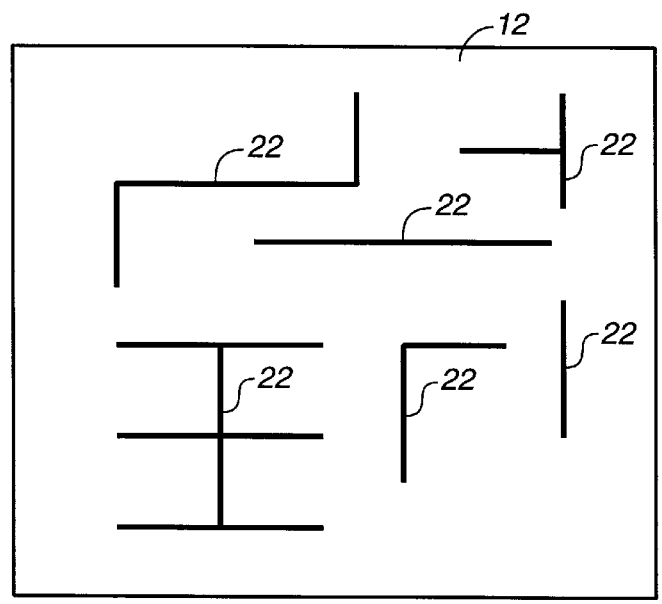
FIG._3

CIRCUIT DEVICE INTERCONNECTION BY DIRECT WRITING OF PATTERNS THEREIN

This application is a continuation application of commonly-owned, U.S. patent application Ser. No. 08/614,024, filed Mar. 12, 1996, U.S. Pat. No. 5,721,150; and is a continuation application of commonly-owned, U.S. patent application Ser. No. 08/434,273, filed May 3, 1995, now abandoned; and is a divisional application of U.S. patent application Ser. No. 08/143,195, filed Oct. 25, 1993, now abandoned.

BACKGROUND OF THE INVENTION

1. Field of the Invention

This invention relates generally to digital integrated circuit fabrication, and in particular, to an apparatus and method wherein conductive patterns are written in amorphous silicon or polysilicon and used for interconnecting circuit elements of the integrated circuit.

2. Description of the Related Technology

Integrated circuits have revolutionized the field of electronics by making possible a level of technological sophistication unknown in the days of vacuum tubes and even discrete transistors. An integrated circuit may comprise, on a small silicon chip, many thousand or even a million or more transistors, including associated diodes, resistors and capacitors, interconnected together to form complex electronic functions. These interconnections may be made by metal deposited in patterns during one or more manufacturing process steps during the fabrication of the integrated circuit chip.

The metal patterns normally are fabricated using masks that determine the shape and size of the metal pattern. When these masks are defective, the resulting metal pattern may also be defective. Sometimes, however, it is possible to interrupt the normal manufacturing process to add or delete conductive paths when the metal pattern is found to be missing or deposited improperly. A defective integrated circuit chip may be reworked by removing protective layers to expose the defective metal areas. Removal of unwanted metal may be done by etching or other means well known in the art. New metal patterns may then be deposited to replace missing metal interconnections.

Thin metal lines may be deposited utilizing an integrated circuit fabrication technology called Focused Ion Beam or FIB deposition. The FIB deposition system may be used to deposit thin metal lines to form a metal pattern in the exposed rework area of the integrated circuit chip needing repair. The FIB deposition system, however, may take tens of hours to deposit a single small metal line because the deposition time is determined by the FIB column fluence. The FIB fluence is the number of atoms of metal that can flow down the ion beam column during a given time. Therefore, repair of defective integrated circuit chip metal connection patterns is extremely time consuming and expensive. What is needed is a way of repairing or replacing defective conductive metal patterns on an integrated circuit chip in a rapid and cost effective manner.

SUMMARY OF THE INVENTION

The present invention solves the above mentioned problem by utilizing a layer of undoped amorphous silicon or polysilicon deposited over the area needing conductive paths in order to repair the integrated circuit chip. The amorphous silicon or polysilicon may be deposited in an undoped condition at low temperature, and then by means of a FIB deposition system, dopant is deposited into the silicon in the desired pattern. The dopant is then activated by selectively heating the silicon with a focused laser beam in the areas requiring low resistivity.

Therefore, it is an object of the present invention to utilize a deposited layer of amorphous silicon or polysilicon selectively doped into a pattern of conductive paths whose resistance is substantially reduced by selectively heating the selectively doped areas. The surrounding non-doped areas of silicon remain as insulators having substantially high resistance. This enables the present invention to be used to quickly and economically repair defective integrated circuits by replacing defective connection paths with conductive silicon connection paths. The present invention may also be utilized for interconnection of circuit elements throughout the entire integrated circuit chip die.

The present invention utilizes a deposited layer of substantially undoped amorphous silicon or polysilicon, depending on the temperature of deposition, which has gigaohm resistance in its undoped state. Sufficient doping is, for example, 0.01 to 0.1 percent by molecular species of materials such as, for example, boron, arsenic, antimony, phosphorus, etc. Dopant may be any material that causes a reduction in the resistance of the pure silicon.

An advantage of the present invention is that the amount of dopant required to be introduced into the silicon by the FIB deposition system is three to four orders of magnitude less than that required for metal conductor deposition. This significant reduction in the number of dopant atoms required enables the FIB deposition system column fluence to be substantially reduced. Because of this reduction, the column fluence is no longer a factor in controlling process time. The present invention, in contrast to the present technology of depositing metal conductors, enables a substantial increase in the speed in which the FIB deposition system may be utilized to directly write conductive patterns in silicon. The present invention significantly improves and speeds up integrated circuit fabrication processing which ultimately results in lower cost and better quality products.

Another advantage of the present invention is that the silicon layer is only doped for conductivity, instead of depositing conductive metal material. By eliminating one or more metal layers in the fabrication of the integrated circuit, not only are costs reduced but the possibility of a competitor reverse engineering the design of the integrated circuit is also substantially reduced. Conductive metal layers are easily observed under an optical microscope. Doped silicon is substantially indistinguishable from undoped silicon under a conventional optical microscope. Therefore, the present invention is more difficult to reverse engineer because of the difficulty in determining the exact dopant patterns contained within the silicon layer. In addition, the present invention may utilize dummy conductive patterns to further protect the underlying proprietary design from discovery by reverse engineering.

The FIB deposition system has had limited usefulness because of the relatively long time required to write pattern an entire integrated circuit chip or even an entire wafer. The present invention, however, utilizes the FIB deposition system in a much more cost and time effective manner by requiring orders of magnitude less atoms to be deposited in the column fluence. The dopant atoms are introduced into the deposited silicon and reach depths within the silicon determined by the implantation energy of the fluence column. Implantation energies may be, for example, 1 KeV to 1 MeV, and result in ion distributions with average depths ranging from about 100 angstroms to 10 micrometers.

As each implanted ion enters the target, it undergoes a series of collisions with the target silicon atoms until it finally comes to rest at some depth within the silicon layer. In polysilicon, some of the dopant ions displace the silicon atoms in crystallite lattice, but most of the dopant ions stop in the interstitial areas of the silicon atoms. Because so few dopant ions displace the silicon atoms in the lattice, the resistance of the silicon is still relatively high for use as a conductor. In addition, the ion beam tends to damage the crystallite silicon lattice. The FIB deposition system, however, has a very narrow deposition beam that may be controlled within 0.5 microns, therefore, ion implantation damage to the lattice is closely confined to those areas requiring conductive patterns.

Damage to the crystallite lattice may be repaired by annealing the affected areas with heat. Heating also will activate the dopant by supplying enough energy to the dopant atoms trapped in the interstitial areas of the lattice to replace silicon atoms in the lattice. Once the lattice is repaired and the dopant atoms are on substitutional sites, the dopant atoms will become electrically active, thus substantially reducing the electrical resistance of the doped areas. In this way the present invention achieves low resistance conductive paths equivalent to deposited metal layer patterns.

Another feature of the present invention is utilizing a focused laser beam to selectively and precisely heat the area of silicon containing dopant, thus repairing lattice damage caused by the dopant bombardment, and activating the dopant atoms in interstitial positions to useful lattice positions. The laser beam performs rapid thermal annealing of the area of the damaged silicon lattice. The rapid thermal annealing of the laser adiabatically anneals the deposited silicon in substantially the area where the dopant atoms were deposited. Focused laser beam annealing may have a beam resolution of, for example, 0.5 to 1 micrometer.

Once the dopant pattern is annealed into conductive low resistance paths, connection to the integrated circuit elements may be automatically made, or further connection to circuit elements may be made by techniques well known to those skilled in the art of fabricating integrated circuit chip dies. In addition, amorphous silicon in the area of annealing becomes conductively doped crystalline polysilicon. Further processing of the integrated circuit may be performed after the conductive paths are annealed, for example, passivating the surface of the chip face or depositing a layer of insulating oxide, or even depositing another layer of amorphous silicon or polysilicon for creating yet another layer of conductive paths.

An advantage of the present invention is the rapid deposition of dopant atoms by an FIB deposition system because the number of dopant atoms needed in the fluence column does not restrict the fluence column writing speed. Thus, the present invention is only substantially limited to the column writing speed required to lay down the required conductive pattern in the dopant deposited amorphous silicon or polysilicon. The writing speed of electron optics columns of FIB deposition systems may be, for example, 100 to 300 MHz, thus an entire integrated circuit chip die may have a dopant pattern written in one minute or less.

Another advantage is fabrication of an integrated circuit having fewer layers needed for insulation and conductive metal paths. Also, the present invention has the advantage of making it substantially more difficult for a competitor to reverse engineer the connection patterns of the finished integrated circuit chip. This is especially important in highly competitive and proprietary Application Specific Integrated Circuit ("ASIC") designs.

Other and further objects, features and advantages will be apparent from the following description of a presently preferred embodiment of the invention, given for the purpose of disclosure and taken in conjunction with the accompanying drawings.

BRIEF DESCRIPTION OF THE DRAWINGS

FIG. 1 is a schematic block diagram elevational view of an FIB deposition system and an integrated circuit wafer;

FIG. 2 is a schematic block diagram elevational view of a focused beam laser system and the integrated circuit wafer; and FIG. 3 is a schematic plan view of a preferred embodiment of the present invention.

DETAILED DESCRIPTION OF A PREFERRED EMBODIMENT

Referring now to the drawings, the details of a preferred embodiment are schematically illustrated. In the drawings like elements have the same number, while similar elements have the same number with a suffix having a different lower case letter. Referring to FIG. 1, an FIB deposition system and an integrated circuit wafer are illustrated in schematic block diagram elevational view. The FIB deposition system 14 emits an ion fluence column 16 containing dopant atoms to be deposited onto a polysilicon layer 12 deposited over the face of an integrated circuit chip die 10. The FIB disposition system 14 causes the ion fluence column 16 to sweep across the surface of the polysilicon layer 12, writing a pattern of dopant atoms in accordance with the desired conductive patterns. The layer 12 may be deposited at temperatures from about room temperature to about 800 degrees Centigrade.

A computer system (not illustrated) may control the ion fluence column 16 writing pattern, and may also modulate the ion fluence column 16 atom fluence, in accordance with a desired dopant depth, or during discontinuities in the dopant being patterned onto the polysilicon layer 12. The amount of dopant required may be, for example, from 0.01 to 0.1% by molecular species of materials such as, for example, boron, arsenic, antimony, phosphorus, etc. Dopant may be any material that causes a reduction in the resistance of the pure polysilicon layer 12. The depth of the dopant atoms is determined by the electron volt acceleration given the atoms by the FIB disposition system 14. The electron volt acceleration may be, for example, 1 KeV to 1 MeV, which may result in dopant atom distributions with average depths ranging from about 100 angstroms to 10 micrometers.

Once the dopant atom patterns are written into the polysilicon layer 12 by the FIB deposition system 14, the polysilicon layer 12 is ready to be annealed. Referring now to FIG. 2, a focused laser beam system and integrated circuit wafer are illustrated in a schematic block diagram elevational view. The focused beam laser system 18 emits a controlled laser beam 20 that anneals selected areas of the polysilicon layer 12 with heat sufficient to activate the dopant by supplying enough energy to the dopant atoms trapped in the interstitial areas of the crystal lattice of the polysilicon layer 12 to replace the silicon atoms in the lattice. The heat from the laser beam 20 also effectively repairs lattice damage caused by the dopant bombardment from the ion fluence column 16 (FIG. 1).

The present invention rapidly and effectively writes dopant patterns into the polysilicon layer 12 in a precise registration that may be as fine as about 0.5 micrometers in pattern line width, and may extend to about 3 micrometers or more in width. The heat annealing done by the laser system 18 by means of the laser beam 20 also has a fine resolution of about 0.5 to 1 micrometer in alignment accuracy. Thus, pattern resolution may approach 1 micrometer or better. Diffusion of the dopant is minimal because of the rapid thermal annealing of the doped silicon.

Referring to FIG. 3, a schematic plan view of a preferred embodiment of patterns in the present invention is illustrated. The polysilicon layer 12 has conductive silicon paths (conductors) 22 made of selectively doped and annealed polysilicon which is located where the dopant atoms were deposited by the FIB deposition system 14 and annealed by the laser beam 20 of the laser system 18. Connection of the silicon conductors 22 may be made to the integrated circuit chip die 10 circuit elements (not illustrated) by means well known to those skilled in the art of fabricating integrated circuits.

Additional layers may be deposited onto the polysilicon layer 12 after the step of annealing above. These layers may be, for example, passivating the surface of the chip face or depositing a layer of insulating oxide, or even depositing another layer of amorphous silicon or polysilicon for creating yet another layer of conductive paths. An advantage of the present invention is that the silicon conductors 22 are substantially invisible in the polysilicon layer 12 to a typical optical microscope. This makes the proprietary design of the integrated circuit layout more secure from reverse engineering a competitor.

It is also readily apparent to those skilled in the art that the polysilicon layer 12 may cover the entire surface of the integrated circuit chip die 10 or just a small part thereof during rework of a defective integrated circuit die. The silicon conductors 22 may have whatever pattern is required for either entire fabrication of the integrated circuit or just repair thereto. The system and method of the present invention, therefore, is well adapted to carry out the objects and attain the ends and advantages mentioned, as well as others inherent therein. While a presently preferred embodiment of the invention has been given for purposes of disclosure, numerous changes in the details of construction, interconnection and arrangement of parts will readily suggest themselves to those skilled in the art, and which are encompassed within the spirit of the invention and the scope of the appended claims.

What is claimed is:

1. A method, in an integrated circuit structure on a semiconductor substrate having a plurality of elements interconnected by conductive silicon paths, said method comprising the steps of:

applying an undoped layer of silicon on a surface of the integrated circuit structure;

providing a computer, a focused ion beam deposition system, and a focused laser beam system;

controlling the focused ion beam deposition system and focused laser beam system with the computer;

implanting dopant atoms in selected areas of the undoped silicon layer with a focused ion beam deposition system; and rapidly heating the selected doped areas of the undoped silicon layer with a focused laser beam system to form conductive silicon paths thereby connecting the plurality of elements.

2. A method, in an integrated circuit structure on a semiconductor substrate having a plurality of circuit elements interconnected by conductive silicon paths, said method comprising the steps of:

applying an undoped layer of polysilicon on a surface of the integrated circuit structure;

implanting dopant atoms with a focused ion beam deposition system in selected areas of the polysilicon layer;

rapidly heating the selected doped areas of the polysilicon layer with a focused laser beam system to form conductive silicon paths therein; and connecting the plurality of elements with the conductive silicon paths, wherein the undoped layer of polysilicon with conductive silicon paths therein is on the surface of the integrated circuit structure.

3. The method of claim 2, wherein the step of implanting dopant atoms by means of the focused ion beam deposition system is done at acceleration potentials from about 1,000 to about 1,000,000 electron-volts.

4. The method of claim 2, wherein the step of implanting dopant atoms comprises implanting atoms of boron, arsenic, antimony or phosphorus into the layer of silicon.

5. A method, in an integrated circuit structure on a semiconductor substrate having a plurality of circuit elements interconnected by conductive silicon paths, said method comprising the steps of:

applying an undoped layer of polysilicon on a surface of the integrated circuit structure;

implanting dopant atoms with a focused ion beam deposition system in selected areas of the polysilicon layer;

rapidly heating the selected doped areas of the polysilicon layer with a focused laser beam system to form conductive silicon paths therein;

controlling the focused ion beam deposition system and focused laser beam system with a computer; and connecting the plurality of elements with the conductive silicon paths, wherein the undoped layer of polysilicon with conductive silicon paths therein is on the surface of the integrated circuit structure.

* * * * *